(12) United States Patent
Bunyan

(10) Patent No.: US 6,410,137 B1
(45) Date of Patent: Jun. 25, 2002

(54) INTUMESCENT, FLAME RETARDANT PRESSURE SENSITIVE ADHESIVE COMPOSITION FOR EMI SHIELDING APPLICATIONS

(75) Inventor: Michael H. Bunyan, Chelmsford, MA (US)

(73) Assignee: Parker-Hannifin Corporation, Cleveland, OH (US)

( * ) Notice: Subject to any disclaimer, the term of this patent is extended or adjusted under 35 U.S.C. 154(b) by 0 days.

(21) Appl. No.: 09/412,059

(22) Filed: Oct. 4, 1999

Related U.S. Application Data

(60) Provisional application No. 60/105,271, filed on Oct. 22, 1998.

(51) Int. Cl.[7] .................. B32B 15/04; B32B 7/12; B32B 19/00
(52) U.S. Cl. ............. 428/356; 428/355 R; 428/402; 428/403; 428/407; 428/920
(58) Field of Search ............. 428/356, 355 R, 428/402, 403, 407, 920

(56) References Cited

U.S. PATENT DOCUMENTS

| | | |
|---|---|---|
| 3,883,481 A | 5/1975 | Kopetz et al. |
| 4,061,828 A | 12/1977 | Petras et al. |
| 4,710,317 A | 12/1987 | Tabata et al. |
| 4,727,107 A | 2/1988 | McConnell et al. |
| 4,857,668 A | 8/1989 | Buonanno |
| 4,871,477 A | 10/1989 | Dimanshteyn |
| 4,895,713 A | 1/1990 | Greinke et al. |
| 5,028,739 A | 7/1991 | Keyser et al. |
| 5,045,635 A | 9/1991 | Kaplo et al. |
| 5,105,056 A | 4/1992 | Hoge, Jr. et al. |
| 5,202,536 A | 4/1993 | Buonanno |
| 5,262,454 A | 11/1993 | Leroux et al. |
| 5,376,450 A | 12/1994 | Greinke et al. |
| 5,498,466 A | 3/1996 | Navarro et al. |
| 5,508,321 A | 4/1996 | Brebner |
| 5,674,606 A | 10/1997 | Powers, Jr. |

FOREIGN PATENT DOCUMENTS

| | | | |
|---|---|---|---|
| WO | WO 96 25469 A | 8/1996 | |

OTHER PUBLICATIONS

Parker–Hannifin Corporation, Chomerics Division, brochure entitled "Soft–Shield" dated 1997.
Material entitled "Expandable Graphite Flake as An Intumescent Retardant Additive" by Daniel Krassowski and Brian Ford of UCAR Carbon Company, Inc. (undated).
Copy of the International Search Report filed in PCT/US98/22404, corresponding to the within matter.

*Primary Examiner*—Duc Truong
(74) *Attorney, Agent, or Firm*—John A. Molnar, Jr.

(57) ABSTRACT

A flame retardant, intumescent pressure sensitive adhesive (PSA) composition for EMI shielding gaskets, tapes, wraps, and the like. The composition is formulated as an admixture of: (a) a PSA component; (b) a halogenated first flame retardant component; (c) a metal-based second flame retardant component; and (d) a filler component of expandable, intercalated graphite particles. In a representative embodiment the PSA component (a) is acrylic-based, the halogenated first flame retardant component (b) is a polybrominated diphenyl compound such as decabromodiphenyl oxide or decabromodiphenyl ether, the metal oxide-based second flame retardant component (c) is antimony oxide, antimony trioxide, or antimony pentoxide, and the filler component (d) is graphite flake.

27 Claims, 2 Drawing Sheets

INTUMESCENT, FLAME RETARDANT PRESSURE SENSITIVE ADHESIVE COMPOSITION FOR EMI SHIELDING APPLICATIONS

RELATED CASES

The present application claims priority to U.S. Provisional Application Ser. No. 60/105,271; filed Oct. 22, 1998.

BACKGROUND OF THE INVENTION

The present invention relates broadly to flame retardant materials for use in electromagnetic interference (EMI) applications, and more particularly to an intumescent, pressure-sensitive adhesive composition particularly adapted for use in EMI shielding gaskets, tapes, wraps, and the like for attaching an electrically-conductive foil, fabric, or other sheath or jacket to a foam core, cable, or other substrate.

The operation of electronic devices including televisions, radios, computers, medical instruments, business machines, communications equipment, and the like is attended by the generation of electromagnetic radiation within the electronic circuitry of the equipment. Such radiation often develops as a field or as transients within the radio frequency band of the electromagnetic spectrum, i.e., between about 10 KHz and 10 GHz, and is termed "electromagnetic interference" or "EMI" as being known to interfere with the operation of other proximate electronic devices.

To attenuate EMI effects, shielding having the capability of absorbing and/or reflecting EMI energy may be employed both to confine the EMI energy within a source device, and to insulate that device or other "target" devices from other source devices. Such shielding is provided as a barrier which is inserted between the source and the other devices, and typically is configured as an electrically conductive and grounded housing which encloses the device. As the circuitry of the device generally must remain accessible for servicing or the like, most housings are provided with openable or removable accesses such as doors, hatches, panels, or covers. Between even the flattest of these accesses and its corresponding mating or faying surface, however, there may be present gaps which reduce the efficiency of the shielding by presenting openings through which radiant energy may leak or otherwise pass into or out of the device. Moreover, such gaps represent discontinuities in the surface and ground conductivity of the housing or other shielding, and may even generate a secondary source of EMI radiation by functioning as a form of slot antenna. In this regard, bulk or surface currents induced within the housing develop voltage gradients across any interface gaps in the shielding, which gaps thereby function as antennas which radiate EMI noise. In general, the amplitude of the noise is proportional to the gap length, with the width of the gap having a less appreciable effect.

For filling gaps within mating surfaces of housings and other EMI shielding structures, gaskets and other seals have been proposed both for maintaining electrical continuity across the structure, and for excluding from the interior of the device such contaminates as moisture and dust. Such seals are bonded or mechanically attached to, or press-fit into, one of the mating surfaces, and function to close any interface gaps to establish a continuous conductive path thereacross by conforming under an applied pressure to irregularities between the surfaces. Accordingly, seals intended for EMI shielding applications are specified to be of a construction which not only provides electrical surface conductivity even while under compression, but which also has a resiliency allowing the seals to conform to the size of the gap. The seals additionally must be wear resistant, economical to manufacture, and capability of withstanding repeated compression and relaxation cycles. For further information on specifications for EMI shielding gaskets, reference may be had to Severinsen, J., "Gaskets That Block EMI," Machine Design, Vol. 47, No. 19, pp. 74–77 (Aug. 7, 1975).

Requirements for typical EMI shielding applications often dictate a low impedance, low profile gasket which is deflectable under normal closure force loads. Other requirements include low cost and a design which provides EMI shielding effectiveness both for the proper operation of the device and, at least in the United States, for compliance with commercial Federal Communication Commission (FCC) EMC standards and other governmental regulations.

A particularly economical gasket construction, which also requires very low closure forces, i.e. less than about 1 lb/inch (0.175 N/mm), is marketed by the Chomerics Division of Parker-Hannifin Corp., Woburn, Mass. under the tradename "Soft-Shield® 4000 Series." Such construction consists of an electrically-conductive foil, fabric-reinforced foil, or fabric jacket or sheathing which is "cigarette" wrapped over a closed-cell polyurethane or other foam core profile which may be in the form of a generally elongate, strip-type gasket or, alternatively, in the form of a "picture frame" or other large surface area shape. As is described further in U.S. Pat. No. 4,871,477, polyurethane foams generally are produced by the reaction of polyisocyanate and a hydroxyl-functional polyol in the presence of a blowing agent. The blowing agent effects the expansion of the polymer structure into a multiplicity of open or closed cells.

The jacket typically is provided as a highly conductive, i.e., about 1 Ω-sq., nickel-plated nylon fabric or fabric-reinforced aluminum foil. The jacket may be machined wrapped over the core and bonded thereto via an interlayer of an acrylic or other pressure-sensitive adhesive (PSA). Similar gasket constructions are shown in commonly-assigned U.S. Pat. No. 5,028,739 and in U.S. Pat. Nos. 4,857,668; 5,054,635; 5,105,056; and 5,202,536.

Many electronic devices, including PC's and communication equipment, must not only comply with certain FCC requirements, but also must meet be approved under certain Underwriter's Laboratories (UL) standards for flame retardancy. In this regard, if each of the individual components within an electronic device is UL approved, then the device itself does not require separate approval. Ensuring UL approval for each component therefore reduces the cost of compliance for the manufacturer, and ultimately may result in cheaper goods for the consumer. For EMI shielding gaskets, however, such gaskets must be made flame retardant, i.e., achieving a rating of V-0 under UL Std. No. 94, "Tests for Flammability of Plastic Materials for Parts in Devices and Appliances" (1991), without compromising the electrical conductivity necessary for meeting EMI shielding requirements.

In this regard, and particularly with respect to EMI shielding gaskets of the above-described fabric over foam variety, it has long been recognized that foamed polymeric materials are flammable and, in certain circumstances, may present a fire hazard. Owing to their cellular structure, high organic content, and surface area, most foam materials are subject to relatively rapid decomposition upon exposure to fire or high temperatures.

One approach for imparting flame retardancy to fabric over foam gaskets has been to employ the sheathing as a flame resistant protective layer for the foam. Indeed, V-0 rating compliance purportedly has been achieved by sheathing the foam within an electrically-conductive Ni/Cu-plated fabric to which a thermoplastic sheet is hot nipped or otherwise fusion bonding to the underside thereof. Such fabrics, which may be further described in one or more of U.S. Pat. Nos. 4,489,126; 4,531,994; 4,608,104; and/or 4,621,013, have been marketed by Monsanto Co., St. Louis, under the tradename "Flectron® Ni/Cu Polyester Taffeta V0."

Other fabric over foam gaskets, as is detailed in U.S. Pat. No. 4,857,668, incorporate a supplemental layer or coating applied to the interior surface of the sheath. Such coating may be a flame-retardant urethane formulation which also promotes the adhesion of the sheath to the foam. The coating additionally may function to reduce bleeding of the foam through the fabric which otherwise could compromise the electrical conductivity of the sheath.

In view of the foregoing, it will be appreciated that further improvements in the design of flame retardant, foam core EMI shielding gaskets, as well as sheathing materials therefore, would be well-received by the electronics industry. Especially desired would be a flame retardant gasket construction which achieves a UL94 rating of V-0.

BROAD STATEMENT OF THE INVENTION

The present invention is directed to an intumescent, flame-retardant pressure-sensitive adhesive (PSA) composition particularly adapted for use in foil or fabric-over-foam EMI shielding gasket constructions for bonding an electrically-conductive foam or fabric sheath or jacket to a polyurethane or other foam core. In being formulated to "intumesce" when exposed to a flame environment, the PSA composition foams or otherwise exhibits a volumetric expansion in developing a thermally insulative, carbonific char.

When employed as an PSA interlayer to bond a fabric or foil wrap to a foam core in an EMI shielding gasket construction, such composition provides a protective, flame retardant layer for the gasket. Gaskets of such construction advantageously have been observed to achieve a UL94 rating of V-0 over a range of cross-section and even at narrow cross-sections down to about 1 mm in thickness. The inventive PSA composition also may be employed within other flame retardant, EMI shielding materials, such as tapes for the wrapping of cables and the like, as coated onto one side of an electrically conductive fabric, mesh, or foil layer.

In a preferred embodiment, the intumescent PSA composition of the present invention is formulated as an acrylic-based PSA which is rendered intumescent and flame retardant via its loading with a unique combination of flame retardant additives. Such combination includes a halogenated first flame retardant component, an metal oxide-based second flame retardant component, and a filler component of expandable, intercalated graphite particles. In a particularly preferred formulation, the halogenated first flame retardant component is a polybrominated diphenyl compound such as a decabromodiphenyl oxide or ether, the metal oxide-based second flame retardant component is antimony oxide, trioxide, or pentoxide, and the filler component is graphite flake.

Unexpectedly, it has been observed that such flame retardant additive combination functions synergistic. In this regard, each of the components separately has been observed not to impart flame retardancy to the PSA composition effective to achieve UL94 V-0 protection within a fabric or foil over foam EMI shielding gasket construction.

A feature of the present invention therefore is to provide a flame retardant, intumescent pressure sensitive adhesive (PSA) composition for EMI shielding gaskets, tapes, wraps, and the like. The composition is formulated as an admixture of: (a) a PSA component; (b) a halogenated first flame retardant component; (c) a metal oxide-based second flame retardant component; and (d) a filler component of expandable, intercalated graphite particles. In a preferred formulation, the PSA component (a) is acrylic-based, the halogenated first flame retardant component is a polybrominated diphenyl compound such as decabromodiphenyl oxide or decabromodiphenyl ether, the metal-based second flame retardant component (c) is antimony oxide, antimony trioxide, or antimony pentoxide; and the filler component (d) is graphite flake.

Another feature of the present invention is to provide a flame retardant, EMI shielding material for wrapping gaskets, cables, and the like. Such material is constructed as having an electrically-conductive layer with a first and second surface, and a flame retardant pressure sensitive adhesive (PSA) layer disposed on one or both of the first or second surface of the electrically-conductive layer. The PSA layer is formed of an intumescent PSA composition which, in turn, is formulated as an admixture of: (a) a PSA component which may be acrylic-based; (b) a halogenated first flame retardant component which may be a polybrominated diphenyl compound such as decabromodiphenyl oxide or decabromodiphenyl ether; (c) a metal-based second flame retardant component which may be antimony oxide, antimony trioxide, or antimony pentoxide; and (d) a filler component of expandable, intercalated graphite particles such as graphite flake.

Yet another feature of the present invention is to provide a flame retardant, electromagnetic interference (EMI) shielding gasket. Such gasket is constructed as having a resilient core member with a circumferentially outer surface, and an electrically-conductive outer member externally surrounding the core member. The outer member is wrapped over the outer surface of the gasket and has an interior surface at least partially covered by a layer of a flame retardant, pressure sensitive adhesive which bonds the outer member to the outer surface of the core member. The PSA layer is formed of an intumescent PSA composition formulated as an admixture of: (a) a PSA component which may be acrylic-based; (b) a halogenated first flame retardant component which may be a polybrominated diphenyl compound such as decabromodiphenyl oxide or decabromodiphenyl ether; (c) a metal-based second flame retardant component which may be antimony oxide, antimony trioxide, or antimony pentoxide; and (d) a filler component of expandable, intercalated graphite particles such as graphite flake.

Advantages of the present invention includes an intumescent, flame retardant PSA composition which provides UL94 V-0 protection when used as an interlayer to bond a metal foil or electrically-conductive fabric jacket to a polyurethane or other foam core within an EMI shielding gasket construction. Further advantages include a flame retardant, electrically-conductive EMI shielding tape for cable shielding applications. These and other advantages will be readily apparent to those skilled in the art based upon the disclosure contained herein.

BRIEF DESCRIPTION OF THE DRAWINGS

For a fuller understanding of the nature and objects of the invention, reference should be had to the following detailed description taken in connection with the accompanying drawings wherein.

Figure 1:
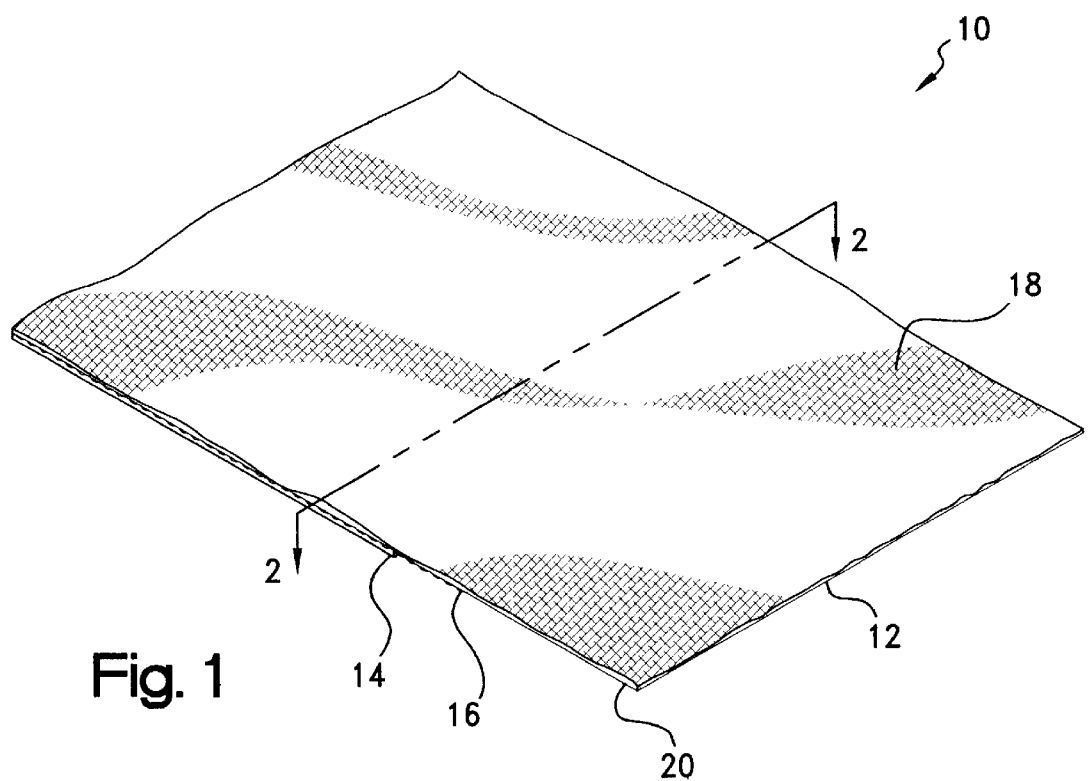
FIG. 1 is a perspective view of one embodiment of a flame retardant EMI shielding material which is adapted for use as a jacket, tape, or other wrap as including an electrically-conductive member on one side of which is coated a layer of the intumescent PSA composition according to the present invention, the view being shown with portions being broken away to better reveal the structure of the material.

The drawings will be described further in connection with the following Detailed Description of the Invention.

DETAILED DESCRIPTION OF THE INVENTION

Certain terminology may be employed in the description to follow for convenience rather than for any limiting purpose. For example, the terms "upper" and "lower" designate directions in the drawings to which reference is made, with the terms "inner" or "interior" and "outer" or "exterior" referring, respectively, to directions toward and away from the center of the referenced element, and the terms "radial" and "axial" referring, respectively, to directions perpendicular and parallel to the longitudinal central axis of the referenced element. Terminology of similar import other than the words specifically mentioned above likewise is to be considered as being used for purposes of convenience rather than in any limiting sense.

For the illustrative purposes of the discourse to follow, the electromagnetic interference (EMI) shielding material incorporating the intumescent PSA composition herein involved is described in connection with its use as a flame retardant, electrically-conductive jacket wrap for a foam core, EMI shielding gasket. Such gasket, which may be of an elongate strip-type or alternatively, of a larger cross-section, "picture frame" type, is adapted to be received within an interface, such as between a door, panel, hatch, cover, or other parting line of an electromagnetic interference (EMI) shielding structure. The EMI shielding structure may be the conductive housing of a computer, communications equipment, or other electronic device or equipment which generates EMI radiation or is susceptible to the effects thereof. The gasket may be bonded or fastened to, or press-fit into one of a pair of mating surfaces which define the interface within the housing, and functions between the mating surfaces to seal any interface gaps or other irregularities. That is, while under an applied pressure, the gasket resiliently conforms to any such irregularities both to establish a continuous conductive path across the interface, and to environmentally seal the interior of the housing against the ingress of dust, moisture, or other contaminates.

It will be appreciated, however, that aspects of the present invention may find utility in other EMI shielding applications such as in EMI shielded tapes or other wraps for cables and the like. Use within those such other applications therefore should be considered to be expressly within the scope of the present invention.

Referring then to the figures, wherein corresponding reference characters are used to designate corresponding elements throughout the several views, a flame retardant EMI shielding material according to the present invention is shown generally at 10 in FIG. 1 as generally adapted for use as a jacket for a foam core gasket construction or as a spiral wrap for cables and the like. For purposes of illustration, material 10 is shown to be of indefinite dimensions which may be cut to size in a sheet or tape form suited for the particular application envisioned. In basic construction, material 10 includes an upper, electrically-conductive member, 12, at least a lower, flame retardant PSA layer, 14, and, optionally, an interlayer, 16, of a fabric or other reinforcement which may be electrically non-conductive. Depending upon the intended application, material 10 additionally may include a second, upper PSA layer (not shown) which is coated onto the opposing surface of member 12.

Figure 2:
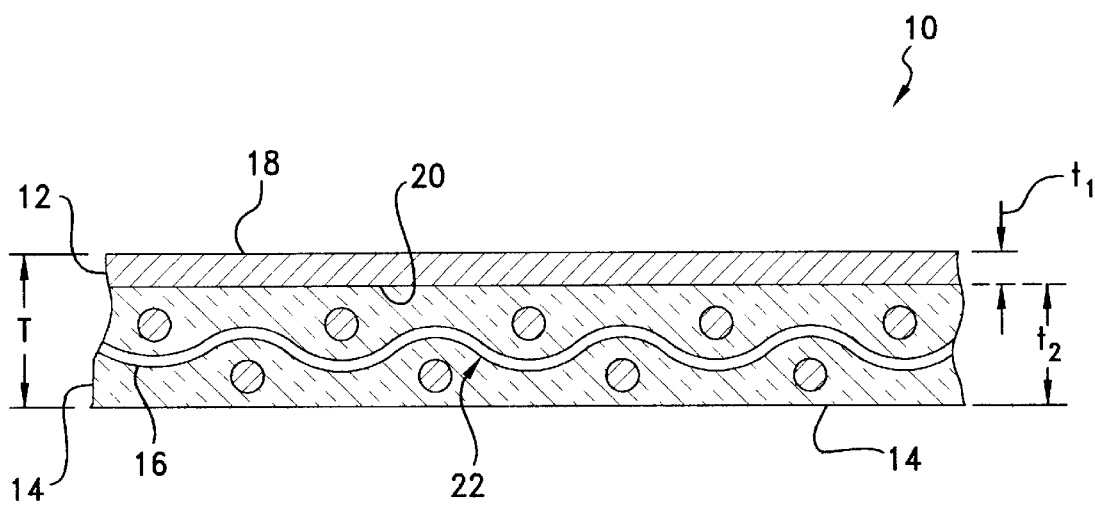
FIG. 2 is an enlarged cross-sectional view of the flame retardant EMI shielding material of FIG. 1 taken through plane represented by line 2—2 of FIG. 1.

Electrically-conductive member 12 has a first side, 18, and a second side, 20, defining a thickness dimension, referenced at "$t_1$" in the cross-sectional view of FIG. 2, which may vary from between about 0.25–5 mils (0.00625–0.125mm). By "electrically-conductive," it is meant that at least the first side 18 of member 12 is rendered conductive, i.e., to a surface resistivity of about 0.1 $\Omega$/sq. or less, by reason of its being constructed of an inherently electrically-conductive metal foil or metal wire, monofilaments, yarns or other fibers or, alternatively, by reason of a treatment such as a plating or sputtering being applied to non-conductive fibers to provide an electrically-conductive layer thereon. Particularly preferred metal foils are aluminum or copper foils having a thickness of between about 0.25–1 mil (0.00625–0.025 mm), with preferred electrically-conductive fibers including Monel nickel-copper alloy, silver-plated copper, nickel-clad copper, Ferrex® tin-plated copper-clad steel, aluminum, tin-clad copper, phosphor bronze, carbon, graphite, and conductive polymers. Preferred non-conductive fibers include cotton, wool, silk, cellulose, polyester, polyamide, nylon, and polyimide monofilaments or yarns which are rendered electrically conductive with a metal plating of copper, nickel, silver, nickel-plated-silver, aluminum, tin, or an alloy thereof. As is known, the metal plating may be applied to individual fiber strands or to the surfaces of the fabric after weaving, knitting, or other fabrication. While fabrics such as wire meshes, knits, and non-woven cloths and webs may find application, a preferred fabric construction for member 12 is a plain weave nylon or polyester cloth which is made electrically conductive with between about 20–40% by weight based on the total fabric weight, i.e., 0.01–0.10 g/in$^2$, of a silver, nickel-silver, or silver-nickel over copper plating.

As may be seen best in the magnified cross-sectional view of material 10 depicted in FIG. 2, with electrically-conductive member 12 being provided as a layer of a metal foil, interlayer 18 preferably is provided as a woven or other fabric which may be formed of an electrically non-conductive material such as polyester, nylon, or fiberglass. Advantageously, interlayer 18 improves the tear resistance and otherwise reinforces foil member 12 for easier handling and cutting without deleteriously affecting the overall drapability of material 10. Interlayer 18 additionally improves the physical properties of material 10 when employed in EMI shielding gasket constructions or other applications.

With continued reference to FIG. 2, it may be seen that interlayer 18 is generally permeable in a having a plain or other woven pattern defining pores or openings between the fibers, one of which is referenced at 22. With PSA layer 16 being coated or otherwise applied to interlayer 18, sufficient permeation therethrough may be achieved for bonding material 10 into a relatively integral structure. However, although a fabric reinforcement layer is preferred, other conventional reinforcement materials may be substituted as incorporated into PSA layer 14 or as otherwise interposed between layers 12 and 14. Such materials include polyimide or other thermoplastic films, and aluminum or other metal screens or expanded meshes. Interlayer 18 itself typically will have a thickness of between about 0.5–5 mils (0.0125–0.125 mm), and together with PSA layer 16 will have a thickness, referenced at "$t_2$" in FIG. 2, of generally between about 5–50 mils (0.125–1.25 mm), and preferably between about 5–8 mils (0.125–0.2 mm).

In accordance with the precepts of the present invention, flame retardant PSA layer 14 is formed of an intumescent PSA composition. Such composition preferably is formulated to be acrylic-based as including a thermoplastic or self-crosslinking or otherwise thermosetting acrylic PSA component which may be a homopolymer, copolymer, terpolymer, interpenetrating network, or blend of an acrylic or (meth)acrylic acid, an acrylate such as ethyl or butyl acrylate or other alcohol ester, and/or an amide such as acrylamide. A preferred self-crosslinking acrylic PSA is marketed commercially by Ashland Chemical Company, Dublin, Ohio, under the trade designation AROSET® 1081-Z-52 (52% solids in 65% toluene, 25% hexane, and 10% isopropanol). Another acrylic-based PSA is marketed commercially by H&N Chemicals, Totowa, N.J., under the trade designation Polytack™ 100 LV as a blend of ethylene acrylate, acetone, isopropyl alcohol, and toluene at 45–50% solids. The term "PSA" is used herein in its conventional sense to mean that the component has a glass transition temperature, surface energy, or other properties such that it exhibits at least some degree of tack at normal room temperature. Such tack may be developed from valence forces, mechanical interlocking action, or a combination thereof.

In this regard, acrylic PSA's are consider preferred for EMI shielding gasket jacketing applications as having an affinity to a variety of substrates including metal foil surfaces. However, in certain applications, such as where adhesion to polyolefins or other low surface energy substrates is required, a silicone-based PSA component, which may be a dry or wet film silicone resin or gum, may be substituted. One silicone PSA, marketed commercially by Adhesives Research, Glen Rock, Pa., under the trade designation 8026, comprises a polydimethylsiloxane gum and resin dispersion. Another silicone PSA is marketed by Flexcon, Spencer, Mass., under the trade designation 1078.

In further accordance with the present invention, flame retardancy is imparted to layer 16 via the admixing of the PSA component of the composition with between about 30–50% by total weight of a unique combination of flame retardant additives which includes a halogenated first flame retardant component, a metal-based second flame retardant component, and a filler component of expandable, intercalated graphite particles. A preferred formulation is, by total weight of the composition, less than about 70% of the PSA component, less than about 10% of the halogenated first flame retardant component, less than about 20% of the metal-based second flame retardant component, and less than about 20% of the filler component.

The halogenated first flame retardant component preferably is a brominated compound, and most preferably a polybrominated diphenyl compound such as decabromodiphenyl ether or decabromodiphenyl oxide. Other halogenated compounds which may find utility include hexabromocyclododecane, decachlorodiphenyl ether, bis(tribromophenoxy)ethane, bis(tribromophenyl) ether, octabromodiphenyl oxide, poly(dibromophenylene oxide), hexabromobenzene, ethylenebistetrabromophthalimide, perchloropentacyclodecane, and the like. Halogenated flame retardant compounds are further described in U.S. Pat. Nos. 4,727,107; 4,710,317; and 3,882,481.

The metal-based second flame retardant component preferably is a metal oxide and most preferably is an antimony compound such as antimony oxide, antimony trioxide, or antimony pentoxide. Other useful antimony-based compounds include antimony triacetate. Antimony-based flame retardant additives are further described in U.S. Pat. Nos. 4,727,107 and 4,710,317.

As to the filler component of formulation, expandable, intercalated graphite particles are well-known in the art, and are further described by Krassowski, D., and Ford, B., "Expandable Graphite Flake as an Intumescent Flame Retardant Additive," paper presented at the Fire and Materials Conference, San Antonio, Tex. (Feb. 24, 1998), and in U.S. Pat. Nos. 5,508,321; 5,498,466; 5,376,450; 5,262,454; and 4,895,713. Such particles, most typically flakes, i.e., platelets, are intercalated with a solution of sulfuric and nitric acid. Upon exposure to high temperatures of over about 300° F. (150° C.), such as within a flame environment, the treated flake expands volumetrically up to about 100 times or more its original thickness, i.e., in the direction perpendicular to the crystalline planes of the graphite. On a weight basis, an expansion of between about 100–200 cc/g is typical. In this regard, the intercalated flake contains trace amounts of nitric and sulfuric acid which is retained on or otherwise entrapped in the flakes along with residual water and air. During the pyrolysis, the vaporization of the entrapped acids, air, and water effects the expansion of the flake. The vaporized acids thereby liberated also are available to catalyze the thermal decomposition of the graphite into an expanded carbonific char or char foam of elemental carbon providing a thermally-insulating or otherwise protective barrier which resists further oxidization.

Advantageously, the acids liberated from the intercalated graphite also are available for the catalytic dehydration of an optional polyhydric char promoter, which may be a polyol such as pentaerythritol or dipentaerythritol, or, alternatively, a sugar, a polyhydric phenol, or a starch. That is, the acids further may react with the hydroxyl functional groups of the char promoter in forming water, carbon dioxide, and an intermediate species such as an ester. Advantageously, the intermediate species may be thermally decomposable to form additional carbonific char which is rendered somewhat self-extinguishing via the liberation of carbon dioxide during the dehydration reaction. Moreover, the latent heat of evaporation of the water condensed by the dehydration of the char promoter endothermically contributes to the insulative effects of the adhesive formulation.

The mean average particle size or distribution of the preferred graphite flake typically will range from between about 50–100 mesh (300–100 μm), with a range of between about 50–80 mesh (300–175 μm) being generally preferred. Because the flakes are planar, the thickness of any flake is generally about one-fifth its mesh size. Intercalated graphite flake of the preferred type is marketed commercially under the trade designation "GRAFGuard™ 160" by UCAR Carbon Company (Cleveland, Ohio).

Within a flame environment, the decomposition of the respective flame retardant compounds have been observed to function synergistically. That is, the decomposition of the halogenated and metal oxide compounds operate to chemically deprive the flame of sufficient oxygen to support combustion, with the pyrolysis of the intercalated graphite filler developing a thermally-insulating char foam. The composition thus is both thermally protective and self-extinguishing.

Additional fillers and additives may be included in the formulation depending upon the requirements of the particular application envisioned and to the extent that the adhesive and intumescent properties of the formulation are not overly compromised. Such fillers and additives may include conventional wetting, opacifying, or anti-foaming agents, chain extending oils, tackifiers, pigments, lubricants, and stabilizers. Other flame retardant additives, such as titanium oxide or zinc oxide, may be employed to provide additional gas nucleation sites in promoting the formation of a finer cell, lower density foam with improved thermal insulation properties. Still other inorganic fillers, including zirconium salts, borates, phosphates, antimonate glass, titanium dioxide, and zirconium dioxide may be employed to form an infrared reflective layer over the top of the foam layer. Silica microballoons and glass-forming materials such as silicates, mica, glass fibers and the like, also may be added as inert, char-reinforcing agents. A solvent, such as methyl ethyl ketone, methyl isobutyl ketone, naphtha, or a mixture thereof, or other diluent may be employed during the compounding of the formulation to lower the viscosity thereof for improved mixing and coatability.

In the production of commercial quantities of intumescent PSA composition of the invention, the PSA and flame retardant components and fillers may be compounded under conditions of high shear in a roll mill or other mixer. After compounding, the composition may be coated on electrically-conductive member 12, with or without reinforcement member 16 interposed therebetween or otherwise incorporated, in a conventional manner. For example, the composition may be sprayed, cast, or knife, roll, drum, dip, or otherwise coated directly onto one or both of the surfaces 18 and 20 of member 12. Alternatively, the composition may be applied using a transfer or other indirect process. After coating, the material 10 may be dried to flash the solvent and develop an adherent PSA film layer 14. As mentioned, a solvent, diluent, or other vehicle may be incorporated during either compounding or coating to control the viscosity of the admixture.

Although not considered critical for purposes of the present invention, the preferred conductive member, film layer, reinforcement member, and ultimately, the overall material thicknesses will represent a convergence of such electrical and physical properties as electrical conductivity and impedance, and peel and shear adhesion strengths. As an example, with reinforcement member 16, material 10 typically will have a thickness, referenced at "T" in the cross-sectional view of FIG. 2, of between about 1.5 mil (0.0375 mm) and 80 mils (2 mm), but again as may be varied depending upon the requirements of the particular application involved.

For ease of use, particularly as a cable wrap or tape, material 10 may be wound into a roll for dispensing and application by an automated or manual process. In this regard, a release liner (not shown) may be provided over the exposed adhesive surface, referenced at 24 in FIG. 2, of PSA layer 14. Exemplary release liners include face stocks or other films of plasticized polyvinyl chloride, polyesters, cellulosics, metal foils, composites, and waxed, siliconized, or other coated paper or plastic having a relatively low surface energy to be removable without appreciable lifting of layer 14 from member 12. In use, with the adhesive surface 24 of layer 12 exposed, the material 10 may be bonded to a foam core, cable, or other substrate under a moderate applied pressure of between about 10–30 psi (0.07–0.20 MPa). Depending upon the application, material 10 may be wrapped either longitudinally or spirally about the substrate to provide an outer EMI shielding layer therefor.

Figure 3:
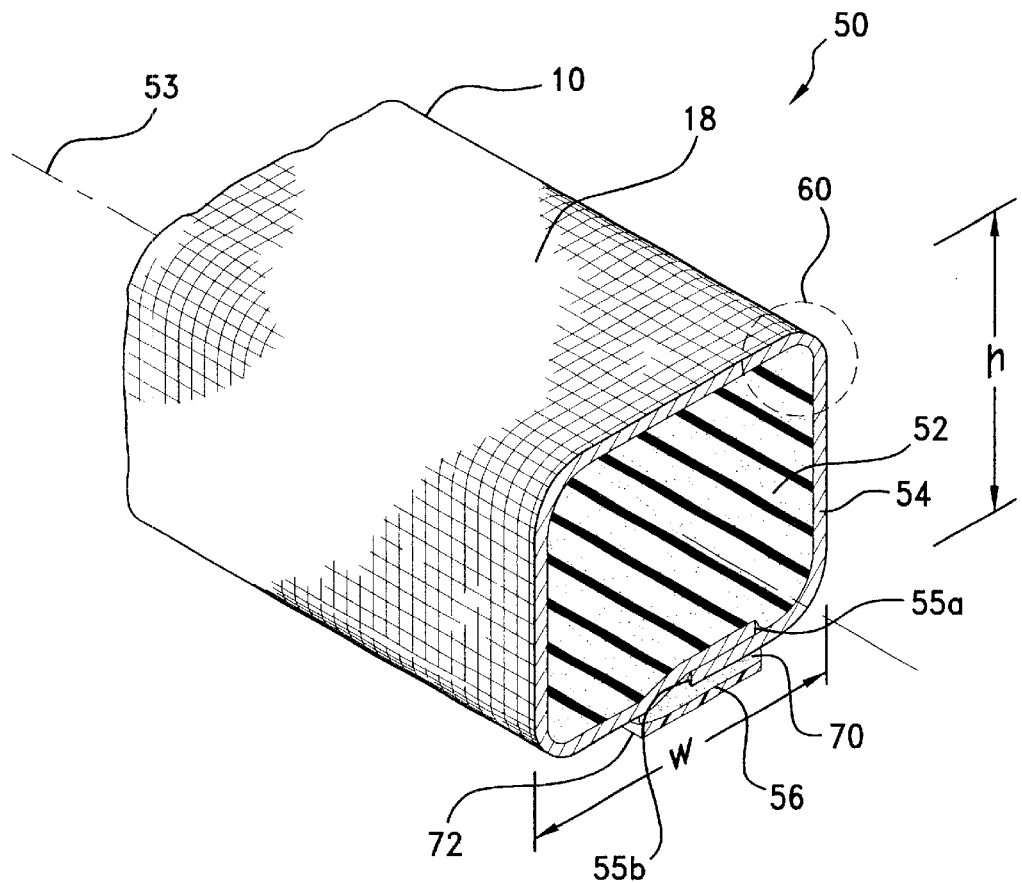
FIG. 3 is a perspective, cross-sectional view of a length of a representative, flame retardant EMI shielding gasket construction according to the present invention including a jacket which is formed of the EMI shielding material of FIG. 1.

As aforementioned, EMI shielding material 10 of the present invention is particularly adapted for use as a flame retardant, electrically-conductive jacket which is "cigarette" wrapped over a foam core in an EMI shielding gasket construction such as gasket 50 of FIG. 3. In a representative embodiment, gasket 50 includes an elongate, resilient foam core member, 52, which may be of an indefinite length as extending lengthwise along a central longitudinal axis, 53. Core member 52 has an outer circumferential surface, 54, which, in turn, extends circumferentially about longitudinal axis 53 in defining a widthwise extent, referenced at "w", and a perpendicular thickness or height dimension, referenced at "h." Of course, the width and height/thickness designations are arbitrary with respect to any particular frame of reference, and therefore may be interchanged.

Core circumferential surface 54 further defines the cross-sectional profile of gasket 50 which, for illustrative purposes, is shown to be of a generally polygonal, i.e., square or rectangular geometry. Other plane profiles, such as circular, semi-circular, or elliptical, or complex profiles may be substituted, however, depending upon the geometry of the interface to be sealed. Core member 12 may be of any radial or diametric extent, but for most strip gasket applications will have a widthwise extent "w" of between about 0.25 inch (0.64 cm) and 1 inch (2.54 cm). For "frame" gasket applications, widthwise extent "w" may be 6 inches (15 cm) or more, with one or more apertures defined therein. The thickness or height "h" will of course vary with the application and particularly with the gap to be sealed, but typically will be between about 0.04–0.4 inch (1–10 mm).

For affording gap-filling capabilities, it is preferred that core member 52 be complaint over a wide range of temperatures, and to exhibit good compression-relaxation hysteresis even after repeated cyclings or long compressive dwells. Core member 52 therefore may be extruded, molded, or otherwise formed of a foamed polymeric and preferably elastomeric material which may be thermoplastic or thermosetting. Preferred foamed materials include polyethylenes, polypropylenes, butadienes, styrene-butadienes, and chlorosulfonates. Particularly preferred foamed materials include open or closed cell polyurethane elastomers, blends such as polyolefin resin/monoolefin copolymer blend, and neoprene, silicone, and nitrile sponge rubbers.

In the illustrated embodiment, shielding material 10 is provided as a sheet which is wrapped as a sheath or jacket over the widthwise extent "w" of core member 52 with the edges, 55a–b, of the sheet being overlapped as at 56 to extend lengthwise along axis 53. Gasket 50 thereby may be provided in a continuous strip as is shown or, alternatively, as individual "kiss" cut pads for "pick and place" applications. Alternatively, shielding material 10 may be provided as a tape which is wrapped helically over the widthwise extent "w" of core member 52 in a succession of overlapping spirals.

Figure 4:
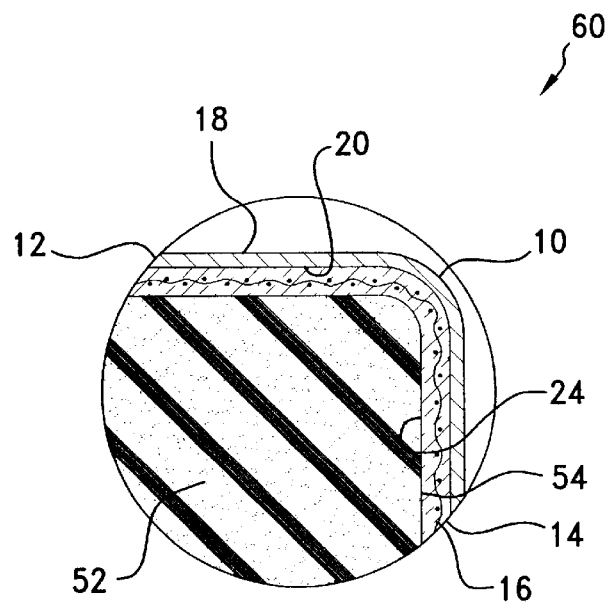
FIG. 4 is an end view of the gasket of FIG. 3 which is magnified to reveal the structure thereof.

As may be seen best with reference to the magnified view of FIG. 3 referenced at 60 in FIG. 4, in the illustrated gasket application, shielding material 10 surrounds core 52 such that the second side 20 of electrically-conductive outer member 12 is disposed as an interior surface which faces core surface 54 with the first side 18 of member 12 being disposed as an oppositely-facing, electrically-conductive exterior surface of the gasket 50. Adhesive layer 14, covering at least a portion of and, preferably, substantially the entirety of the outer member interior surface 20, thereby bonds the outer member to the core surface 54. Gasket construction 50 advantageously provides a structure that may be used in very low closure force, i.e. less than about 1 lb/inch (0.175 N/mm), applications.

Referring again to FIG. 3, a second pressure sensitive adhesive layer, referenced at 70, may be applied along the underside of the lengthwise extent of gasket 50 to the exterior surface 18 of shielding material 10 for the attachment of the gasket to a substrate. Such layer 70 advantageously may be formulated as is PSA layer 14 to be intumescent and flame retardant. Alternatively, and as is described in U.S. Pat. No. 4,988,550, other suitable PSA's for EMI shielding applications include formulations based on silicones, neoprene, styrene butadiene copolymers, acrylics, acrylates, polyvinyl ethers, polyvinyl acetate copolymers, polyisobutylenes, and mixtures, blends, and copolymers thereof. Acrylic-based formulations, however, generally are considered to be preferred for the EMI applications of the type herein involved. Although PSA's are preferred for adhesive layer 70, other adhesives such as epoxies and urethanes may be substituted and, accordingly, are to be considered within the scope of the present invention. Heat-fusible adhesives such a hot-melts and thermoplastic films additionally may find applicability.

Inasmuch as the bulk conductivity of gasket 50 is determined substantially through its surface contact with the substrate, an electrically-conductive PSA may be preferred to ensure optimal EMI shielding performance. Such adhesives conventionally are formulated as containing about 1–25% by weight of a conductive filler to yield a volume resistivity of from about 0.01–0.0001 Ω-cm. The filler may be incorporated in the form of particles, fibers, flakes, microspheres, or microballoons, and may range in size of from about 1–100 microns. Typical filler materials include inherently conductive material such as metals, carbon, and graphite, or nonconductive materials such as plastic or glass having a plating of a conductive material such as a noble metal or the like. In this regard, the means by which the adhesive is rendered electrically conductive is not considered to be a critical aspect of the present invention, such that any means achieving the desired conductivity and adhesion are to be considered suitable.

For protecting the outer portion of adhesive layer 70 which is exposed on the exterior surface of the gasket, a release sheet, shown at 72, may be provided as removably attached to the exposed adhesive. As is common in the adhesive art, release sheet 72 may be provided as strip of a waxed, siliconized, or other coated paper or plastic sheet or the like having a relatively low surface energy so as to be removable without appreciable lifting of the adhesive from the exterior surface 18 of shielding material 10.

The Example to follow, wherein all percentages and proportions are by weight unless otherwise expressly indicated, is illustrative of the practicing of the invention herein involved, but should not be construed in any limiting sense.

EXAMPLE

A representative EMI shielding material according to the present invention was constructed for characterization. In this regard, a master batch of a flame retardant, intumescent PSA composition was compounded by admixing, by weight, 6700 g AROSET 1810 acrylic PSA, 579 g antimony oxide, 1736 g decabromodiphenyl oxide, and 3000 g UCAR 160 expandable graphite. The viscosity of the formulation was thinned with 1000 g MEK.

The admixture was coated to a total thickness of about 8 mils (0.125 mm) on one side of a fiberglass-fabric reinforced aluminum foil sheet. A sample gasket construction was prepared by "cigarette" wrapping the coated sheet around a length of a 0.25-inch (0.635 cm) thick by 0.5-inch (1.275 cm) wide polyurethane foam profile.

The gasket sample was subjected to an in-house vertical flame test. The portion of the gasket exposed to the flame was observed to expand or "mushroom" in forming a protective, carbonific char. Further, the gasket was observed to be self-extinguishing in arresting the flame spread. Thus, it was concluded that the gasket sample would be meet the applicable Underwriters Laboratories (UL) requirements of a flame class rating of V-0 under UL Standard 94.

The foregoing results confirm that the EMI shielding material of the present invention is UL94 V-0 compliant when used as a jacketing in a fabric-over-foam gasket construction. Unexpectedly, it was found that the use of a unique combination of three different flame retardant additives was critical in the use of any of the additives alone or without one of the other additives was insufficient to meet the required UL-V0 criteria.

As it is anticipated that certain changes may be made in the present invention without departing from the precepts herein involved, it is intended that all matter contained in the foregoing description shall be interpreted as illustrative and not in a limiting sense. All references cited herein are expressly incorporated by reference.

What is claimed is:

1. A flame retardant, EMI shielding material comprising:
    an electrically-conductive layer having first surface and a second surface; and
    a flame retardant pressure sensitive adhesive (PSA) layer disposed on one or both of said first or second surface of said electrically-conductive layer, said PSA layer being formed of an intumescent PSA composition comprising an admixture of:
    (a) a PSA component;
    (b) a halogenated first flame retardant component;
    (c) a metal-based second flame retardant component; and
    (d) a filler component of expandable, intercalated graphite particles.

2. The EMI shielding material of claim 1 wherein said intumescent PSA composition comprises, by weight of components (a)–(d), less than about 70% of said PSA component (a); less than about 10% of said halogenated first flame retardant component (b); less than about 20% of said metal-based second flame retardant component (c); and less than about 20% of said filler component (d).

3. The EMI shielding material of claim 1 wherein said PSA component (a) is acrylic-based; said halogenated first flame retardant component (b) is a polybrominated diphenyl compound; and said metal-based second flame retardant component (c) is antimony-based.

4. The EMI shielding material of claim 3 wherein said halogenated first flame retardant component (b) is decabromodiphenyl oxide or decabromodiphenyl ether, and said second flame retardant component (c) is antimony oxide, antimony trioxide, or antimony pentoxide.

5. The EMI shielding material of claim 1 wherein said filler component (d) is expandable graphite flake.

6. The EMI shielding material of claim 5 wherein said graphite flake has a mean average particle size of between 50–100 mesh (300–100 μm).

7. The EMI shielding material of claim 1 wherein said PSA layer has a thickness of between about 5–50 mils (0.125–1.25 mm).

8. The EMI shielding material of claim 1 wherein said electrically-conductive layer is fabric or mesh which comprises: cotton, wool, silk, cellulose, polyester, polyamide, nylon, or polyimide fibers having an electrically-conductive coating wherein said coating is copper, nickel, silver, aluminum, tin, carbon, graphite, or a combination thereof; copper, nickel, silver, aluminum, bronze, and tin wire and alloys thereof; carbon, graphite, and conductive polymer fibers; or combinations thereof.

9. The EMI shielding material of claim 8 wherein said electrically-conductive layer comprises a metal foil.

10. The EMI shielding material of claim 9 further comprising a fabric reinforcement layer interposed between said electrically-conductive layer and said PSA layer.

11. A flame retardant, intumescent pressure sensitive adhesive (PSA) composition comprising an admixture of:
(a) a PSA component;
(b) a halogenated first flame retardant component;
(c) a metal-based second flame retardant component; and
(d) a filler component of expandable, intercalated graphite particles.

12. The PSA composition of claim 11 which comprises, by weight of components (a)–(d), less than about 70% of said PSA component (a); less than about 10% of said halogenated first flame retardant component (b); less than about 20% of said metal-based second flame retardant component (c); and less than about 20% of said filler component (d).

13. The PSA composition of claim 11 wherein said PSA component (a) is acrylic-based; said halogenated first flame retardant component (b) is a polybrominated diphenyl compound; and said metal-based second flame retardant component (c) is antimony-based.

14. The PSA composition of claim 13 wherein said halogenated first flame retardant component (b) is decabromodiphenyl oxide or decabromodiphenyl ether, and said second flame retardant component (c) is antimony oxide, antimony trioxide, or antimony pentoxide.

15. The PSA composition of claim 11 wherein said filler component (d) is expandable graphite flake.

16. The PSA composition of claim 15 wherein said graphite flake has a mean average particle size of between about 50–100 mesh (300–100 μm).

17. A flame retardant, electromagnetic interference (EMI) shielding gasket comprising:
a resilient core member extending lengthwise along a central longitudinal axis and having an outer surface extending circumferentially about said longitudinal axis in defining a widthwise extent of said gasket;
an electrically-conductive outer member externally surrounding said core member, said outer member being wrapped over the widthwise extent of said gasket and having an interior surface disposed facing the outer surface of said core member and an oppositely-facing exterior surface; and
a flame retardant, pressure sensitive adhesive (PSA) layer covering at least a portion of the interior surface of said outer member and bonding said outer member to the outer surface of said core member, said PSA layer being formed of an intumescent PSA composition comprising an admixture of:
(a) a PSA component;
(b) a halogenated first flame retardant component;
(c) a metal-based second flame retardant component; and
(d) a filler component of expandable, intercalated graphite particles.

18. The gasket of claim 17 wherein said PSA composition comprises, by weight of components (a)–(d), less than about 70% of said PSA component (a); less than about 10% of said halogenated first flame retardant component (b); less than about 20% of said metal-based second flame retardant component (c); and less than about 20% of said filler component (d).

19. The gasket of claim 17 wherein said PSA component (a) is acrylic-based; said halogenated first flame retardant component (b) is a polybrominated diphenyl compound; and said metal-based second flame retardant component (c) is antimony-based.

20. The gasket of claim 19 wherein said halogenated first flame retardant component (b) is decabromodiphenyl oxide or decabromodiphenyl ether, and said second flame retardant component (c) is antimony oxide, antimony trioxide, or antimony pentoxide.

21. The gasket of claim 17 wherein said filler component (d) is expandable graphite flake.

22. The gasket of claim 21 wherein said graphite flake has a mean average particle size of between about 50–100 mesh (300–100 μm).

23. The gasket of claim 17 wherein said PSA layer has a thickness of between about 5–50 mils (0.125–1.25 mm).

24. The gasket of claim 17 wherein said electrically-conductive outer comprises a fabric or mesh selected from the group consisting of: cotton, wool, silk, cellulose, polyester, polyamide, nylon, and polyimide fibers coated with an electrically-conductive material wherein said material is copper, nickel, silver, aluminum, tin, carbon, graphite, or a combination thereof; copper, nickel, silver, aluminum, bronze, and tin wire and alloys thereof, carbon, graphite, and conductive polymer fibers; and combinations thereof.

25. The gasket of claim 24 wherein said electrically-conductive outer layer comprises a metal foil.

26. The gasket of claim 25 further comprising a fabric reinforcement layer interposed between said electrically-conductive layer and said PSA layer.

27. The gasket of claim 17 wherein said core member is formed of a foamed elastomeric material selected from the group consisting of polyethylenes, polypropylenes, polypropylene-EPDM blends, butadienes, styrene-butadienes, nitriles, chlorosulfonates, neoprenes, urethanes, silicones, and combinations thereof.

* * * * *